US012464651B2

(12) United States Patent
Ito et al.

(10) Patent No.: US 12,464,651 B2
(45) Date of Patent: Nov. 4, 2025

(54) WIRING CIRCUIT BOARD AND METHOD FOR MANUFACTURING SAME

(71) Applicant: NITTO DENKO CORPORATION, Osaka (JP)

(72) Inventors: Masaki Ito, Osaka (JP); Hayato Takakura, Osaka (JP); Ryohei Kakiuchi, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 346 days.

(21) Appl. No.: 17/783,212

(22) PCT Filed: Dec. 2, 2020

(86) PCT No.: PCT/JP2020/044775
§ 371 (c)(1),
(2) Date: Jun. 7, 2022

(87) PCT Pub. No.: WO2021/124879
PCT Pub. Date: Jun. 24, 2021

(65) Prior Publication Data
US 2023/0009006 A1   Jan. 12, 2023

(30) Foreign Application Priority Data

Dec. 17, 2019   (JP) .................. 2019-227109

(51) Int. Cl.
*H05K 3/28* (2006.01)
*H05K 1/05* (2006.01)
*H05K 3/44* (2006.01)

(52) U.S. Cl.
CPC .................. *H05K 3/28* (2013.01); *H05K 1/05* (2013.01); *H05K 3/44* (2013.01)

(58) Field of Classification Search
CPC ............... H05K 3/28; H05K 1/05; H05K 3/44
(Continued)

(56) References Cited

U.S. PATENT DOCUMENTS

2005/0212113 A1   9/2005 Iimura et al.
2008/0149361 A1   6/2008 Ishii et al.
(Continued)

FOREIGN PATENT DOCUMENTS

CN   101511149 A   8/2009
CN   101562946 A   10/2009
(Continued)

OTHER PUBLICATIONS

International Search Report issued in PCT/JP2020/044775 on Mar. 2, 2021.
(Continued)

*Primary Examiner* — Tremesha W Burns
(74) *Attorney, Agent, or Firm* — Edwards Neils LLC; Jean C. Edwards, Esq.

(57) ABSTRACT

A method for manufacturing a wiring circuit board includes first forming an insulating base layer on a one-side surface in a thickness direction of a metal sheet, second forming a conductor layer on a one-side surface in the thickness direction of the insulating base layer so that a width of a wire is smaller than a width W2 of a wiring body base portion, third forming an insulating cover layer on a one-side surface in the thickness direction of the wiring body base portion exposed from the wire so that the wire is covered with the insulating cover layer and a width of a wiring body cover portion is smaller than the width W2, and fourth forming a metal supporting layer by etching the metal sheet from both sides in the thickness direction so that a width of a wiring body metal portion is smaller than the width W2.

1 Claim, 5 Drawing Sheets

(58) Field of Classification Search
USPC .......................................................... 174/251
See application file for complete search history.

(56) References Cited

U.S. PATENT DOCUMENTS

| | | |
|---|---|---|
| 2009/0202949 A1 | 8/2009 | Takemura |
| 2009/0263748 A1 | 10/2009 | Takemura |
| 2010/0243297 A1* | 9/2010 | Oosawa ................ H05K 1/025 |
| | | 156/196 |
| 2011/0318609 A1 | 12/2011 | Miura et al. |
| 2014/0048311 A1 | 2/2014 | Ishii et al. |
| 2015/0156892 A1 | 6/2015 | Tanabe et al. |
| 2016/0057867 A1 | 2/2016 | Yamauchi et al. |
| 2016/0266050 A1 | 9/2016 | Toyoda |
| 2016/0295694 A1 | 10/2016 | Fujimura |
| 2018/0102757 A1 | 4/2018 | Fukushima et al. |
| 2021/0212196 A1 | 7/2021 | Ito et al. |

FOREIGN PATENT DOCUMENTS

| | | |
|---|---|---|
| CN | 101848601 A | 9/2010 |
| CN | 103974564 A | 8/2014 |
| CN | 104703400 A | 6/2015 |
| CN | 105376960 A | 3/2016 |
| CN | 106028636 A | 10/2016 |
| CN | 107615658 A | 1/2018 |
| JP | 2003-321796 A | 11/2003 |
| JP | 2008-159899 A | 7/2008 |
| JP | 2011-176075 A | 9/2011 |
| JP | 2012-014755 A | 1/2012 |
| JP | 2013-145627 A | 7/2013 |
| JP | 2013-200909 A | 10/2013 |
| JP | 2013-251291 A | 12/2013 |
| JP | 2014-038681 A | 2/2014 |
| JP | 2014-191845 A | 10/2014 |
| JP | 2019-212659 A | 12/2019 |
| WO | 2019/230334 A1 | 12/2019 |

OTHER PUBLICATIONS

Written Opinion issued in PCT/JP2020/044775 on Mar. 2, 2021.
Notification of Reasons for Refusal issued in Japanese Patent Application No. 2019-227109 on Sep. 28, 2021.
Decision of Refusal issued in Japanese Patent Application No. 2019-227109 on Nov. 9, 2021.
Reconsideration Report by Examiner before Appeal issued in Japanese Patent Application No. 2019-227109 on Mar. 31, 2022.
Office Action, which was issued by Taiwan Intellectual Property Office on Jun. 26, 2024, in connection with Taiwanese Patent Application No. 109143032.
International Preliminary Report on Patentability issued by WIPO on May 17, 2022, in connection with International Patent Application No. PCT/JP2020/044775.
Notification of Reasons to Refusal which was issued by the Japanese Patent Office on Apr. 25, 2023, in connection with Japanese Patent Application No. 2022-017899.
Office Action, issued by the Vietnamese Patent Office on Dec. 30, 2024, in connection with Vietnamese Patent Application No. 1-2022-03740.
Office Action, issued by the State Intellectual Property Office of China on Mar. 21, 2025, in connection with Chinese Patent Application No. 202080086158.9.
Office Action, issued by the Korean Intellectual Property Office on Feb. 18, 2025, in connection with Korean Patent Application No. 10-2022-7019528.
He Bo et al., Production of Fine Lines (30mm/30mm) Applied in COF, Printed Circuit Information, Mar. 10, 2008, No. 3, pp. 29-32, China Academic Journal Electronic Publishing House, China.
Zhu Jiman et al., Application of "Ideal" Insulated Metal Substrates in Ball Grid Array (BGA) Packages, Rare Metal Materials and Engineering, Apr. 30, 2004, pp. 432-435, vol. 33, No. 4, China Academic Journal Electronic Publishing House, China.

* cited by examiner

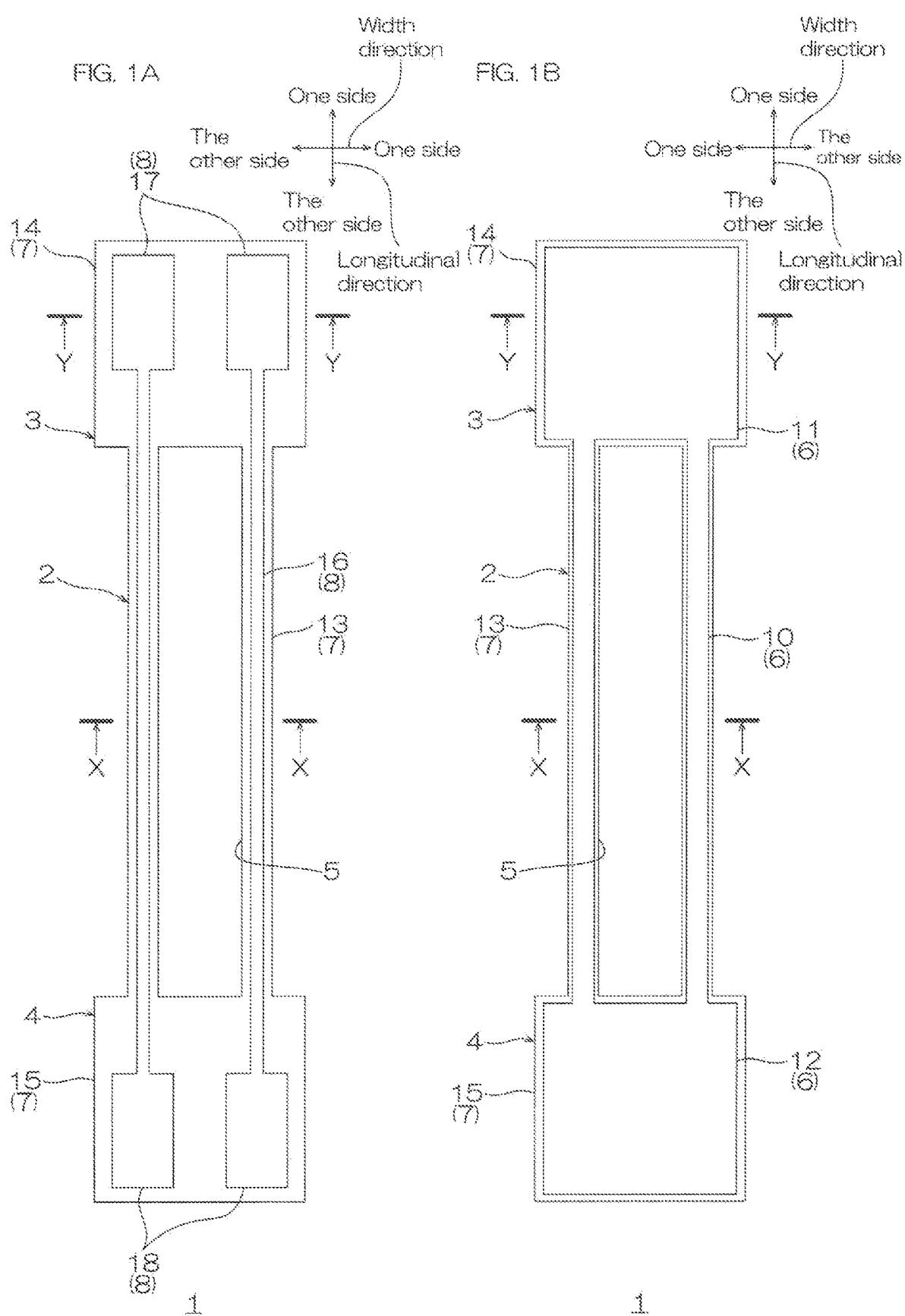

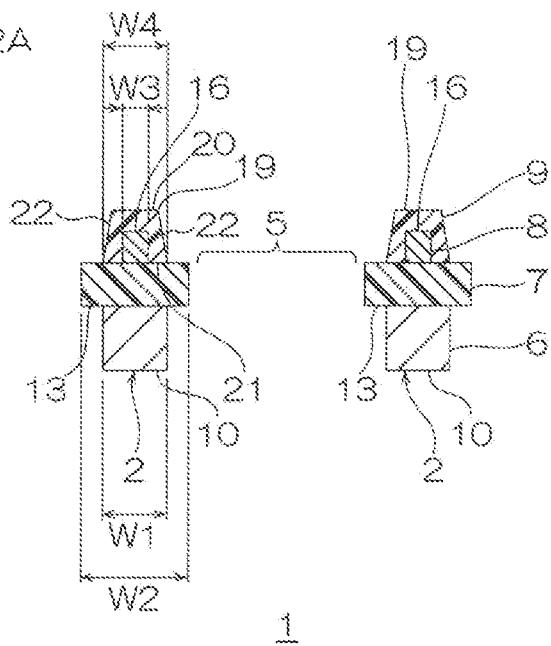
FIG. 2A
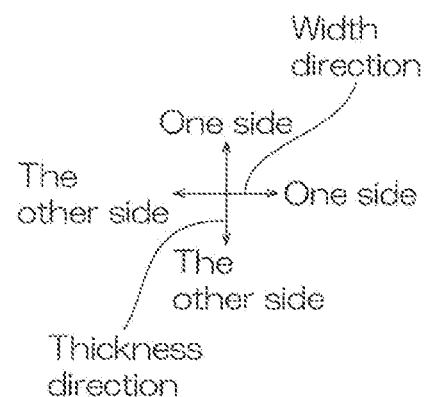
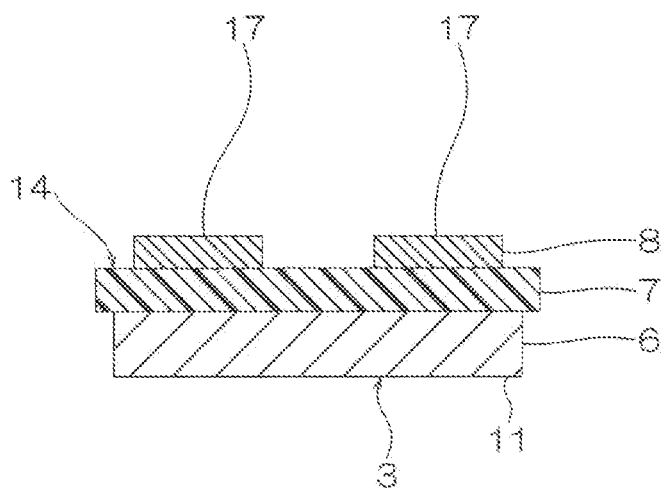
FIG. 2B
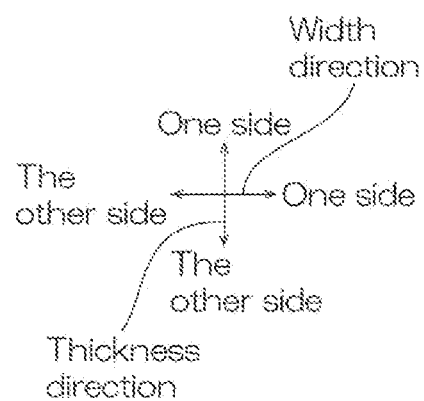

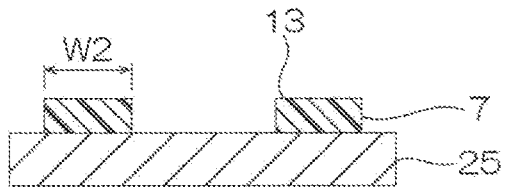
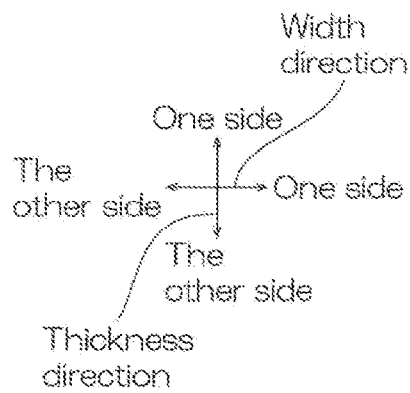
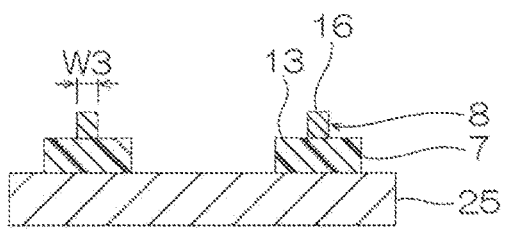
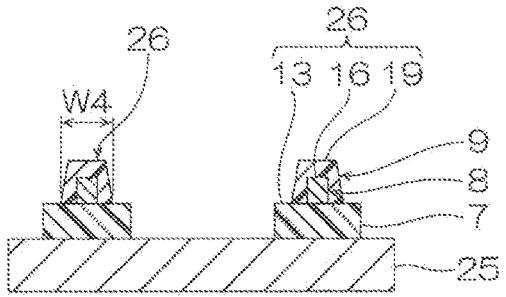
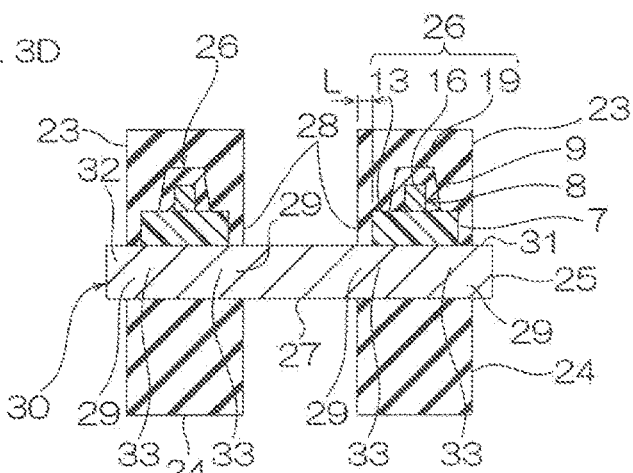
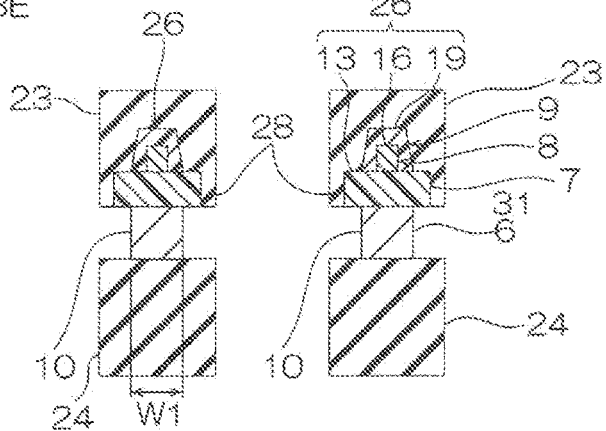

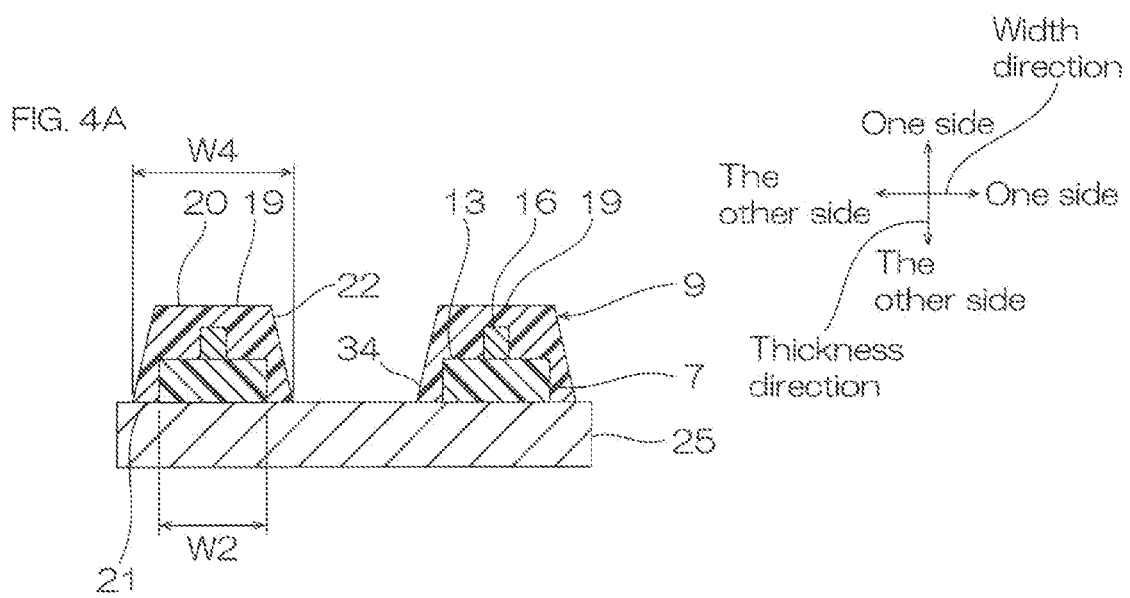
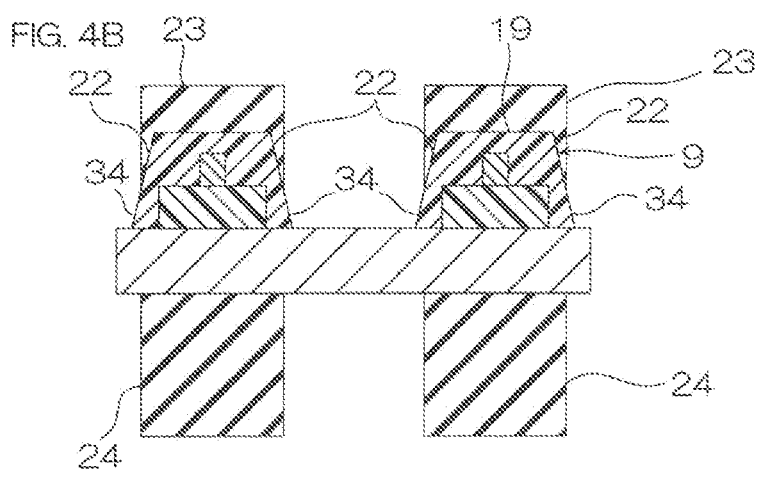

WIRING CIRCUIT BOARD AND METHOD FOR MANUFACTURING SAME

CROSS-REFERENCE TO RELATED APPLICATIONS

The present application is a 35 U.S.C. 371 National Stage Entry of: PCT/JP2020/044775, filed on Dec. 2, 2020, which claims priority from Japanese Patent Application No. 2019-227109, filed on Dec. 17, 2019, the contents of all of which are herein incorporated by reference in their entirety.

TECHNICAL FIELD

The present invention relates to a wiring circuit board and a method for manufacturing the wiring circuit board.

BACKGROUND ART

There is a known wiring circuit board that includes a metal supporting layer, an insulating base layer disposed on the metal supporting layer, a wire disposed on the insulating base layer, and an insulating cover layer disposed on the metal supporting layer to cover the insulating base layer and wire (for example, see Patent document 1 below).

In the wiring circuit board of Patent document 1, the insulating cover layer has a width larger than that of the insulating base layer.

Further, according to Patent document 1, the insulating base layer, wire and insulating cover layer are sequentially formed on a metal sheet. Thereafter, the outer shape of the metal sheet is processed by etching to form the metal supporting layer.

CITATION LIST

Patent Document

Patent Document 1: Japanese Unexamined Patent Publication No. 2008-159899

SUMMARY OF THE INVENTION

Problem to be Solved by the Invention

However, for example, in light of production efficiency, the etching may be carried out by bring the etching solution into contact with the metal sheet from both above and below. Such a case requires etching resists disposed in a predetermined pattern on both the upper and lower surfaces of the metal sheet.

Further, depending on the use and purpose of the wiring circuit board, the metal supporting layer is required to be narrower than the insulating base layer in width.

When the insulating cover layer is wider than the insulating base layer as described in Patent Document 1, an end of the insulating cover layer tends to protrude beyond an end of the etching resist in the width direction. This results in a disadvantage that the insulating cover layer spreading beyond the end of the etching resist may hinder etching the metal supporting layer into a desired pattern when the outer shape of the metal sheet is processed by etching the metal sheet from above and below to form the metal supporting layer.

The present invention provides a method for manufacturing a wiring circuit board in which a metal supporting layer can be formed into a desired shape by etching the metal sheet, and the wiring circuit board manufactured by the method.

Means for Solving the Problem

The present invention [1] includes a method for manufacturing a wiring circuit board, the method comprising: a first step of forming an insulating base layer on a one-side surface in a thickness direction of a metal sheet; a second step of forming a wiring layer on a one-side surface in the thickness direction of the insulating base layer so that a width of the wiring layer is smaller than a width of the insulating base layer, each of the widths being a length in a direction orthogonal to a direction in which the wiring layer extends and the thickness direction; a third step of forming an insulating cover layer on the one-side surface in the thickness direction of the insulating base layer exposed from the wiring layer so that the insulating cover layer covers the wiring layer and has a width smaller than the width of the insulating base layer; and a fourth step of forming a metal supporting layer by etching the metal sheet from both sides in the thickness direction so that the metal supporting layer has a width smaller than the width of the insulating base layer.

In the third step of this manufacturing method, the insulating cover layer having a smaller width than the insulating base layer is formed. Further, in the fourth step, the metal supporting layer having a smaller width that the insulating base layer is formed.

Thus, when the first resist in conformity to the outer shape of the metal supporting layer is formed at one side in the thickness direction of the metal sheet, the first resist can cover the ends in the width direction of the insulating cover layer having a smaller width than the insulating base layer. This suppresses the defective formation of the metal supporting layer caused by the outward protrusion of an end in the width direction of the insulating cover layer beyond an end in the width direction of the first resist, and thus allows for the formation of the metal supporting layer in a desired shape.

The present invention [2] includes the method described in [1], wherein in the fourth step, the metal sheet is separated into a plurality of metal bodies by an interval on a cross section orthogonal to the extending direction of the wiring layer, in the first step, the insulating base layer corresponding to each of the metal bodies is formed, in the second step, at least one of the wiring layers corresponding to each of the metal bodies is formed, and in the third step, the insulating cover layer corresponding to each of the metal bodies is formed.

In the fourth step of the present manufacturing method, the insulating base layer, one of the wiring layers, and the insulating cover layer are formed, corresponding to each of the metal bodies. This allows for the design of the outer shape of each of the metal bodies in conformity to the insulating base layer, one of the wiring layers, and the insulating cover layer.

The present invention [3] includes the method described in [2], wherein the fourth step includes: a fifth step of disposing a first resist on the one-side surface in the thickness direction of the metal sheet to cover the insulating base layers and insulating cover layers corresponding to each of the metal bodies; a sixth step of disposing a second resist on the other-side surface in the thickness direction of the metal sheet so that the second resist overlaps the first resist when being projected in the thickness direction; and a seventh step of etching the metal sheet to side etch overlapping portions of the metal sheet that overlap both ends in the width direction of each of the first resist and second resist.

In the manufacturing method, the etching of the metal sheet is carried out to side etch the overlapping portions of the metal sheet, which overlap both the ends in the width direction of each of the first resist and second resist. This ensures the formation of the metal supporting layer narrower than the insulating base layer.

The present invention [4] includes a wiring circuit board including: a metal supporting layer; an insulating base layer disposed on a one-side surface in the thickness direction of the metal supporting layer; a wiring layer disposed on a one-side surface in the thickness direction of the insulating base layer and having a width smaller than a width of the insulating base layer, each of the widths in a direction orthogonal to a direction in which the wiring layer extends and the thickness direction; and an insulating cover layer disposed on the one-side surface in the thickness direction of the insulating base layer to cover the wiring layer and having a width smaller than the width of the insulating base layer, wherein the metal supporting layer has a width smaller than the width of the insulating base layer In the wiring circuit board, the metal supporting layer and the insulating cover layer are each narrower than the insulating base layer in width. In other words, the insulating base layer is the widest at a part where the layers are laminated in the wiring circuit board. Thus, the laminate part can have a narrow shape in conformity to the width of the insulating base layer.

Effects of the Invention

The present invention provides a wiring circuit board and a manufacturing method thereof, in both of which a metal supporting layer is formed into a desired shape.

BRIEF DESCRIPTION OF THE DRAWINGS

FIG. 1A and FIG. 1B illustrate one embodiment of the wiring circuit board manufactured by the method of the present invention. FIG. 1A is a plan view thereof. FIG. 1B is a bottom view thereof.

FIG. 2A and FIG. 2B are cross-sectional views of the wiring circuit board of FIG. 1A and FIG. 1B. FIG. 2A is a frontal cross-sectional view taken along line X-X. FIG. 2B is a frontal cross-sectional view taken along line Y-Y.

FIG. 3A to FIG. 3E illustrate the steps of the method for manufacturing the wiring circuit board of FIG. 2A. FIG. 3A illustrates a first step of forming an insulating base layer. FIG. 3B illustrates a second step of forming a conductive layer. FIG. 3C illustrates a third step of forming an insulating cover layer. FIG. 3D illustrates a fifth step and a sixth step of forming a first resist and a second resist, respectively. FIG. 3E illustrates a seventh step of etching a metal sheet.

FIG. 4A and FIG. 4B illustrate the steps of the manufacturing method of a variation. FIG. 4A illustrates a third step thereof. FIG. 4B illustrates fifth and sixth steps thereof.

DESCRIPTION OF THE EMBODIMENTS

One Embodiment

Figure 5:
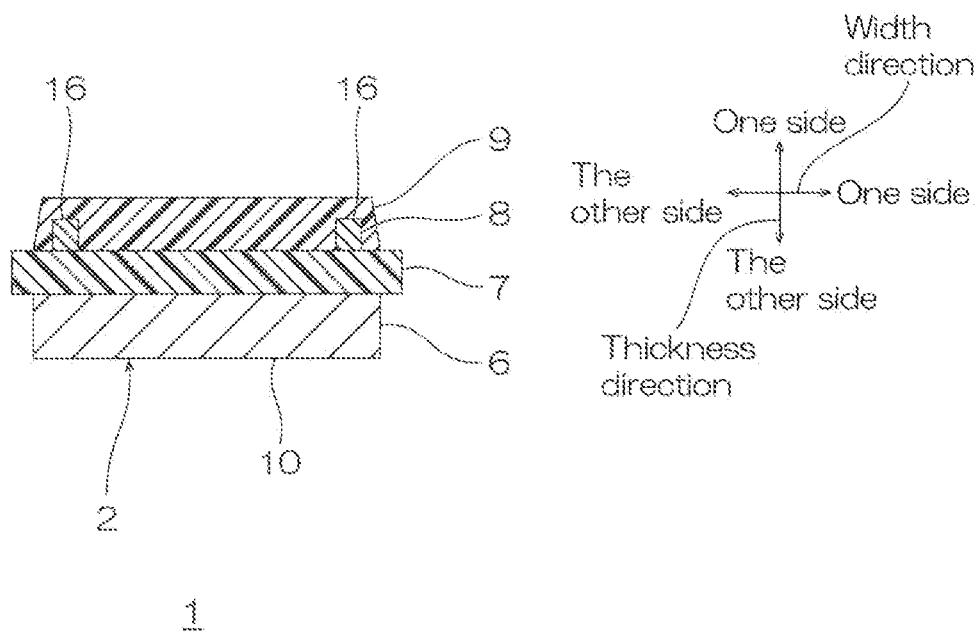
FIG. 5 is a cross-sectional view of a variation of the wiring circuit board of FIG. 2A (a mode in which one wiring body metal portion is provided with a plurality of wires).

First, one embodiment of the wiring circuit board of the present invention is described with reference to FIG. 1A and FIG. 2B. FIG. 1A omits an insulating cover layer 9 that is described below to clearly show a relative disposition of an insulating base layer 7 and a conductive layer 8 that are described below as well.

As illustrated in FIG. 1A to FIG. 2B, a wiring circuit board 1 has a predetermined thickness and a shape extending in a longitudinal direction. The wiring circuit board 1 integrally includes a wiring body 2, a first connecting body 3, and a second connecting body 4.

The wiring body 2 extends in the longitudinal direction. The wiring body 2 is an intermediate portion in the longitudinal direction of the wiring circuit board 1. A plurality (two) of the wiring bodies 2 are disposed in a width direction orthogonal to the thickness direction and the longitudinal direction, while holding a space therebetween. The wiring bodies 2 each have an approximately straight line shape along the longitudinal direction.

The first connecting body 3 connects one-side edges in the longitudinal direction of the wiring bodies 2 in the width direction. The first connecting body 3 is one end in the longitudinal direction of the wiring circuit board 1. The first connecting body 3 has, for example, an approximately rectangular shape in the plan view.

The second connecting body 4 connects the other edges in the longitudinal direction of the wiring bodies 2 in the width direction. The second connecting body 4 is the other end in the longitudinal direction of the wiring circuit board 1. The second connecting body 4 has, for example, an approximately rectangular shape in the plan view.

The wiring circuit board 1 further includes an opening 5. The opening 5 is surrounded by the wiring bodies 2, the first connecting body 3, and the second connecting body 4. The opening 5 penetrates the wiring circuit board 1 in the thickness direction. The opening 5 has an approximately rectangular shape in the plan view. The opening 5 has a slit shape separating the wiring bodies 2 in the width direction.

As illustrated in FIG. 2A and FIG. 2B, the wiring circuit board 1 includes a metal supporting layer 6, an insulating base layer 7, a conductive layer 8, and an insulating cover layer 9 (not illustrated in FIG. 2B).

As illustrated in FIG. 1B, the metal supporting layer 6 has a shape (an approximately similar shape) slightly smaller than the outer shape of the wiring circuit board 1. The metal supporting layer 6 integrally has wiring body metal portions 10 corresponding to the wiring bodies 2, a first connecting metal portion 11 corresponding to the first connecting body 3, and a second connecting metal portion 12 corresponding to the second connecting body 4.

As illustrated in FIG. 1B and FIG. 2A, the wiring body metal portions 10 correspond to the wiring bodies 2, respectively. Each of the wiring body metal portions 10 is narrower (or shorter in length in the width direction) than each of the outer shapes of the wiring bodies 2. The wiring body metal portions 10 each have, for example, an approximately rectangular shape in the cross-sectional view. The cross-sectional view is a surface that is cut in a direction orthogonal to a direction in which the wiring bodies 2 extend (a direction along the width direction and the thickness direction), and the same applies hereinafter. Each of the wiring body metal portions 10 is disposed inside both edges in the width direction of the wiring body 2 in the width direction.

As illustrated in FIG. 1B and FIG. 2B, the first connecting metal portion 11 is disposed inside the peripheral edge of the first connecting body 3 in the surface direction.

As illustrated in FIG. 1B, the second connecting metal portion 12 is disposed inside the peripheral edge of the second connecting body 4 in the width direction.

The material of the metal supporting layer 6 is not especially limited and may be any one of transition metals and typical metals. Specific examples of the material of the metal supporting layer 6 include the Group 2 metal elements such as calcium, the Group 4 metal elements such as titanium and zirconium, the Group 5 metal elements such as vanadium, the Group 6 metal elements such as chromium, molybdenum, and tungsten, the Group 7 metal elements such as manganese, the Group 8 metal elements such as iron, the Group 9 metal elements such as cobalt, the Group 10 metal elements such as nickel and platinum, the Group 11 metal elements such as copper, silver, and gold, the Group 12 metal elements such as zinc, the Group 13 metal elements such as aluminum and gallium, and the Group 14 metal elements such as germanium and tin. These can be used singly or in combination of two or more.

The metal supporting layer 6 has a thickness of, for example, 10 μm or more, preferably 50 μm or more, and, for example, 10 mm or less. The wiring body metal portions 10 each have a width W1 of, for example, 5 μm or more, preferably 10 μm or more, and, for example, 500 μm or less, preferably 300 μm or less. The width W1 of each wiring body metal portion 10 is the maximum distance between both end surfaces in the width direction of the wiring body metal portion 10.

As illustrated in FIG. 2A and FIG. 2B, the insulating base layer 7 is disposed on a one-side surface in the thickness direction of the metal supporting layer 6. The insulating base layer 7 has the same outer shape as that of the wiring circuit board 1. As illustrated in FIG. 1A and FIG. 1B, the insulating base layer 7 integrally has wiring body base portions 13 corresponding to the wiring bodies 2, a first connecting base portion 14 corresponding to the first connecting body 3, and a second connecting base portion 15 corresponding to the second connecting body 4.

As illustrated in FIG. 1A to FIG. 2A, the wiring body base portions 13 have the same outer shapes as those of the wiring bodies 2. In other words, a plurality (two) of the wiring body base portions 13 are provided corresponding to the wiring bodies 2. Each of the wiring body base portions 13 has, for example, an approximately rectangular shape in the cross-sectional view. Each of the wiring body base portions 13 has a width W2 greater than the width W1 of the wiring body metal portion 10. When being projected in the thickness direction, both ends in the width direction of each of the wiring body base portions 13 protrude outward beyond both the end surfaces in the width direction of the wiring body metal portion 10. In other words, both the ends in the width direction of each wiring body base portion 13 have the other-side surfaces in the thickness direction exposed to the other side in the thickness direction. In other words, the other-side surface in the thickness direction of each wiring body base portion 13 has both ends in the width direction exposed from the wiring body metal portion 10. The other-side surface in the thickness direction of each wiring body base portion 13 has an intermediate portion in the width direction in contact with the whole of the one-side surface in the thickness direction of the wiring body metal portion 10.

As illustrated in FIG. 1B and FIG. 2B, the first connecting base portion 14 has the same outer shape as that of the first connecting body 3. The first connecting base portion 14 has, for example, an approximately rectangular shape larger than the first connecting metal portion 11 in the bottom surface view.

The second connecting base portion 15 has the same outer shape as that of the second connecting body 4. The second connecting base portion 15 has, for example, an approximately rectangular shape larger than the second connecting metal portion 12 in the bottom surface view.

Examples of the material of the insulating base layer 7 include insulating resin such as polyimide.

The insulating base layer 7 has a thickness of, for example, 1 μm or more, preferably 3 μm or more, and, for example, 100 μm or less, preferably 50 μm or less. The width W2 of the wiring body base portion 13 is, for example, 15 μm or more, preferably 40 μm or more, and, for example, 800 μm or less, preferably 500 μm or less. The ratio of the width W2 of the wiring body base portion 13 to the width W1 of the wiring body metal portion 10 (W2/W1) is more than 1, preferably 1.05 or more, more preferably 1.1 or more, even more preferably 1.25 or more, and, for example, 5 or less, preferably 3 or less.

As illustrated in FIG. 2A and FIG. 2B, the conductive layer 8 is disposed on a one-side surface in the thickness direction of the insulating base layer 7. As illustrated in FIG. 1A, the conductive layer 8 integrally has wires 16 that correspond to the wiring bodies 2 and exemplify wiring layers, first terminals 17 that correspond to the first connecting body 3, and second terminals 18 that correspond to the second connecting body 4.

The wires 16 are provided to the wiring bodies 2, respectively. As illustrated in FIG. 2A, each of the wires 16 is disposed at an intermediate portion (specifically a central part) in the width direction of the one-side surface in the thickness direction of each of the wiring body base portions 13. The wires 16 each have a width W3 smaller than the width W1 of the wiring body metal portion 10. Further, when being projected in the thickness direction, each of the wires 16 is included in the wiring body metal portion 10. Each of the wires 16 has an approximately rectangular shape in the cross-sectional view.

As illustrated in FIG. 1A, the first terminals 17 continue to one-side edges in the longitudinal direction of the wires 16, respectively. Each of the first terminals 17 has, for example, an approximately rectangular shape in the plan view. The first terminals 17 are disposed on a one-side surface in the thickness direction of the first connecting base portion 14. The first terminals 17 are provided corresponding to the wires 16.

The second terminals 18 are connected to the other-side edges in the longitudinal direction of the wires 16, respectively. Each of the second terminals 18 has, for example, an approximately rectangular shape in the plan view. The second terminals 18 are disposed on a one-side surface in the thickness direction of the second connecting base portion 15. The second terminals 18 are provided corresponding to the wires 16.

Examples of the material of the conductive layer 8 include copper, silver, gold, iron, aluminum, chromium, and alloys thereof. To achieve excellent electrical properties, copper is preferred.

The conductive layer 8 has a thickness of, for example, 1 μm or more, preferably 3 μm or more, and, for example, 50 μm or less, preferably 30 μm or less. The width W3 of each wire 16 is, for example, 1 μm or more, preferably 5 μm or more, and, for example, 200 μm or less, preferably 100 μm or less. The ratio (W3/W2) of the width W3 of each wire 16 to the width W2 of the wiring body base portion 13 is less than 1, preferably 0.9 or less, preferably 0.8 or less, more preferably 0.7, even more preferably 0.5 or less, and, for example, 0.01 or more, preferably 0.1 or more. The ratio (W3/W1) of the width W3 of each wire 16 to the width W1 of the wiring body metal portion 10 is, for example, 0.1 or more, preferably 0.2 or more, and, for example, 5 or less, preferably 2 or less.

As illustrated in FIG. 2A, the insulating cover layer 9 is disposed on the one-side surface in the thickness direction of the insulating base layer 7 to cover the conductive layer 8. When being projected in the thickness direction, the insulating cover layer 9 is included in the insulating base layer 7. The insulating cover layer 9 has wiring body cover portions 19 that correspond to the wiring bodies 2.

A plurality of (two) wiring body cover portions 19 are provided corresponding to the (two) wiring bodies 2. Each of the wiring body cover portions 19 has an approximately U shape, for example, open toward the other side in the thickness direction in the cross-sectional view. Each of the wiring body cover portions 19 has a one-side surface 20 in the thickness direction, the other-side surface 21 facing the one-side surface 20 at the other side in the thickness direction, and both side surfaces 22. One of the both side surfaces connects a one-side edge of the one-side surface 20 and a one-side edge of the other-side surface 21 in the width direction. The other side surface connects the other-side edge of the one-side surface 20 and the other-side edge of the other-side surface 21 in the width direction. The thickness-direction one-side surface 20 has a flat surface parallel to the one-side surface in the thickness direction of each wiring body base portion 13. The other-side surface 21 is in contact with the one-side surface in the thickness direction of each wire 16, both side surfaces in the width direction of each wire 16, and the one-side surface in the thickness direction of each wiring body base portion 13 around the wire 16. Both the side surfaces 22 form a tapered surface while the facing distance between them gradually reduces toward one side in the thickness direction.

Examples of the material of the insulating cover layer 9 include insulating resin such as polyimide.

The thickness of the insulating cover layer 9 is an interval between the one-side surface 20 in the thickness direction of each wiring body cover portion 19 and the one-side surface in the thickness direction of the wire 16. The thickness of the insulating cover layer 9 is specifically, for example, 1 μm or more, preferably 5 μm or more, and, for example, 100 μm or less, preferably 50 μm or less. The wiring body cover portions 19 each have a width W4 that is the maximum distance between both the side surfaces 22 in the cross-sectional view, smaller than the width W2 of the wiring body base portion 13, and greater than the width W3 of the wire 16. The width W4 of each wiring body cover portion 19 is, for example, 10 μm or more, preferably 30 μm or more, and, for example, 500 μm or less, preferably 300 μm or less. The ratio (W4/W2) of the width W4 of each wiring body cover portion 19 to the width W2 of the wiring body base portion 13 is less than 1, preferably 0.95 or less, more preferably 0.9 or less, even more preferably 0.8 or less, and, for example, 0.5 or more.

Next, a method of manufacturing the wiring circuit board 1 is described with reference to FIG. 3A to FIG. 3E. This method includes a first step of forming the insulating base layer 7 on the one-side surface in the thickness direction of the metal sheet 25, a second step of forming the conductive layer 8 on the one-side surface in the thickness direction of the insulating base layer 7, a third step of covering the wires 16 with the insulating cover layer 9, and a fourth step of forming the metal supporting layer 6 by etching the metal sheet 25. The first step to fourth step are sequentially carried out in the manufacturing method. The manufacturing method is carried out by, for example, a roll-to-roll method.

As illustrated in FIG. 3A, a metal sheet 25 is prepared first in the first step.

The metal sheet 25 is a metallic base material for forming the metal supporting layer 6, and has an outer shape larger than the metal supporting layer 6. The material and thickness of the metal sheet 25 are the same as those of the metal supporting layer 6.

Subsequently, a varnish containing a photosensitive insulating resin is applied on the whole of the one-side surface in the thickness direction of the metal sheet 25. Thereafter, photolithography is carried out to form the insulating base layer 7 having the wiring body base portions 13, the first connecting base portion 14 (see FIG. 2B), and the second connecting base portion 15 (see FIG. 1A and FIG. 1B).

As illustrated in FIG. 3B, the second step is carried out to form the conductive layer 8 having the wires 16, the first terminals 17 (see FIG. 2B), and the second terminals 18 (see FIG. 1A to FIG. 1B) on the one-side surface in the thickness direction of the insulating base layer 7 by, for example, an additive process or a subtractive process. The width W3 of each wire 16 is smaller than the width W2 of the wiring body base portion 13.

As illustrated in FIG. 3C, in the third step, a varnish containing a photosensitive insulating resin is applied on the whole of the one-side surfaces in the thickness direction of the metal sheet 25, the insulating base layer 7 and the conductive layer 8, and thereafter photolithography is carried out to form the insulating cover layer 9 having the wiring body cover portions 19. The wiring body cover portions 19 cover the wires 16. The width W4 of each wiring body cover portion 19 is smaller than the width W2 of the wiring body base portion 13.

As illustrated in FIG. 3E, the fourth step is carried out to form the metal supporting layer 6 by etching the metal sheet 25 from both sides in the thickness direction, so that the width W1 of each wiring body metal portion 10 of the wiring body 2 becomes smaller than the width W2 of the wiring body base portion 13.

As illustrated in FIG. 3D and FIG. 3E, the fourth step includes a fifth step of disposing a first resist 23 on the one-side surface in the thickness direction of the metal sheet 25, a sixth step of disposing a second resist 24 on the other-side surface in the thickness direction of the metal sheet 25, and a seventh step of etching the metal sheet 25. The fifth step and the sixth step are simultaneously carried out. Alternatively, the fifth step is followed by the sixth step. Alternatively, the sixth step is followed by the fifth step.

In the fifth step, the first resist 23 is disposed on the one-side surface in the thickness direction of the metal sheet 25 to cover the wiring body base portions 13, the wires 16, and the wiring body cover portions 19. In other words, the first resist 23 covers wiring body units 26, each of which is formed from one of the wiring body base portions 13, one of the wires 16, and one of the wiring body cover portions 19.

The first resist 23 does not collectively cover the (two) wiring body units 26 adjacent to each other in the width direction. The first resist 23 exposes a central portion 27 between the (two) wiring body units 26 on the one-side surface in the thickness direction of the metal sheet 25.

The first resist 23 covers both end surfaces (both side surfaces) in the width direction of the (two) wiring body base portions 13.

The first resist 23 has end surface covering portions 28 that cover both the end surfaces in the width direction of the wiring body base portions 13. The end surface covering portions 28 each have a width-direction length L that is appropriately set depending on the amount of the side etching of the subsequent seventh step and the width W1 of the wiring body metal portion 10 formed at the seventh step. The width-direction length L of each of the end surface covering portions 28 of the wiring body base portions 13 is, for example, 1 μm or more, preferably 3 μm or more, and, for example, 50 μm or less, preferably 25 μm or less.

The first resist 23 exposes a one-side remote portion 31 on the one-side surface in the thickness direction of the metal sheet 25, where the one-side remote portion 31 is remote outward from the wiring body unit 26 that is located at the furthermost part from the center at the one side in the width direction. The first resist 23 exposes the other-side remote portion 32 on the one-side surface in the thickness direction of the metal sheet 25, where the other-side remote portion 32 is remote outward from the wiring body unit 26 that is located at the furthermost part from the center at the other side in the width direction.

In the fifth step, a dry film resist is first disposed on the whole of the one-side surfaces in the thickness direction of the metal sheet 25, the insulating base layer 7, and the insulating cover layer 9. Thereafter, photolithography is carried out to form the first resist 23 having the above-described shape.

In the sixth step, the second resist 24 is disposed on the other-side surface in the thickness direction of the metal sheet 25 so that the second resist 24 overlaps the first resist 23 when being projected in the thickness direction. The second resist 24 has the same pattern as that of the first resist 23 when being projected in the thickness direction. Specifically, a dry film resist is disposed on the whole of the other-side surface in the thickness direction of the metal sheet 25. Thereafter, photolithography is carried out to form the second resist 24 having the above-described shape.

The fifth step and the sixth step are carried out, thereby producing a resist laminate 30 including the second resist 24, the metal sheet 25, the insulating base layer 7, the conductive layer 8, the insulating cover layer 9, and the first resist 23. In the resist laminate 30, the metal sheet 25 includes the end surface covering portions (both the width-direction ends) 28 of the first resist 23, and overlapping portions (metallic inside parts) 29 overlapping both the ends in the width direction of the second resist 24.

In the seventh step, the metal sheet 25 is etched from one side and the other side in the thickness direction. For example, the outer shape of the metal sheet 25 is processed by wet etching using an etching solution. Specifically, the etching solution is brought into contact with the one-side surface and the other-side surface in the thickness direction of the resist laminate 30.

The contact of the etching solution with the one-side surface and the other-side surface in the thickness direction of the metal sheet 25 first removes the central portion 27, the one-side remote portion 31, and the other-side remote portion 32 of the metal sheet 25.

Subsequently, the overlapping portions 29 (metallic inside parts) are removed. In other words, the overlapping portions 29 are side-etched.

With the progress of the side etching, both end parts 33 of the metal sheet 25 that are located at the other sides in the thickness direction of both the ends in the width direction of the wiring body base portions 13 is removed. In other words, both the end parts 33 are also side-etched. In other words, in the seventh step, the central portion 27, the one-side remote portion 31, and the other-side remote portion 32 of the metal sheet 25 are removed by etching, and then the overlapping portions 29 and both the end parts 33 of the metal sheet 25 are side-etched.

The seventh step is carried out, thereby forming the metal sheet 25 on the metal supporting layer 6. The metal sheet 25 corresponding to the wiring body units 26 is separated into the (two) wiring body metal portions 10 by an interval in the width direction in a cross section orthogonal to a direction in which the wires 16 extend.

In this manner, the wiring circuit board 1 including the metal supporting layer 6, the insulating base layer 7, the conductive layer 8, and the insulating cover layer 9 is manufactured.

Operations and Effects of One Embodiment

In this manufacturing method, as illustrated in FIG. 3C, the third step is carried out to form the insulating cover layer 9 so that the width W4 of each wiring body cover portion 19 is smaller than the width W2 of the wiring body base portion 13. Further, as illustrated in FIG. 3E, the fourth step is carried out to form the metal supporting layer 6 so that the width W1 of each wiring body metal portion 10 is smaller than the width W2 of the wiring body base portion 13.

Thus, as illustrated in FIG. 3D, when the first resist 23 in conformity to the outer shapes of the wiring body metal portions 10 is formed at one side in the thickness direction of the metal sheet 25, the first resist 23 can cover the ends in the width direction of the wiring body cover portions 19 having a width smaller than that of the wiring body base portion 13. This can suppress the defective formation of the wiring body metal portions 10 caused by the outward protrusion of an end in the width direction of the wiring body cover portion 19 over an end in the width direction of the first resist 23 (the defective formation is described in Comparative Example next). Consequently, a metal supporting layer 6 having the wiring body metal portions 10 in a desired shape can be formed.

On the other hand, Comparative Example shows that, in the third step illustrated in FIG. 4A, an insulating cover layer 9 is formed so that the width W4 of each wiring body cover portion 19 is greater than the width W2 of the wiring body base portion 13. Thus, when the first resist 23 in conformity to the outer shapes of the wiring body metal portions 10 is formed at one side in the thickness direction of the metal sheet 25 in the fifth step, the first resist 23 cannot cover (the other ends 34 in the thickness direction of) both the side surfaces 22 of wiring body cover portions 19 having a greater width than the wiring body base portions 13 and exposes both the side surfaces 22 illustrated in FIG. 4B. This causes (the other ends 34 in the thickness direction of) both the side surfaces 22 of the wiring body cover portions 19 to function as an etching resist and results in the defective formation (poor accuracy) of the wiring body metal portions 10. In other words, the wiring body metal portions 10 having a greater width than the desired width. Consequently, a metal supporting layer 6 having the wiring body metal portions 10 in a desired shape cannot be formed.

As illustrated in FIG. 3A and FIG. 3C, in the fourth step of the manufacturing method of one embodiment, the wiring body base portion 13, one of the wires 16, and the wiring body cover portion 19 are formed, corresponding to each of the wiring body metal portions 10. Thus, the outer shape of each of the wiring body metal portions 10 can be designed while corresponding to the wiring body base portion 13, one of the wires 16, and the wiring body cover portion 19.

Further, in this manufacturing method, the etching of the metal sheet 25 includes the side etching of the overlapping portions 29 (and both the ends 33) of the metal sheet 25. This can surely form the wiring body metal portions 10 narrower than the wiring body base portions 13 in width.

In the wiring circuit board 1 as illustrated in FIG. 2A, the width W1 of the wiring body metal portion 10 and the width W4 of the wiring body cover portion 19 are each smaller than the width W2 of the wiring body base portion 13. In other words, the width W2 of the wiring body base portion 13 is the largest at the wiring body 2, which is a laminate part where the portions are laminated. Thus, the wiring body 2 can have a narrow shape in conformity to the width W2 of the wiring body base portion 13.

Variations

In each of the variations, the same members and steps as in one embodiment are given the same numerical references and the detailed descriptions thereof are omitted. Further, the variations can have the same operations and effects as those of one embodiment unless especially described otherwise. Furthermore, one embodiment and the variations can appropriately be combined.

As illustrated in FIG. 5, a wiring circuit board 1 does not have an opening 5 (see FIG. 2A). A plurality of (two) wires 16 is provided to one wiring body metal portion 10. In other words, the wiring circuit board 1 includes one wiring body 2, and the wiring body 2 includes the (two) wires 16.

One embodiment is preferred to the variation of FIG. 5. In the fourth step of one embodiment, as illustrated in FIG. 2A and FIG. 3E, one wire 16 is formed corresponding to each of the wiring body metal portions 10 as a one-to-one correspondence. Thus, the outer shape of each of the wiring body metal portions 10 can be designed in conformity to the corresponding wire 16.

While the illustrative embodiments of the present invention are provided in the above description, such is for illustrative purpose only and it is not to be construed as limiting in any manner. Modification and variation of the present invention that will be obvious to those skilled in the art is to be covered by the following claims.

INDUSTRIAL APPLICABILITY

The wiring circuit board is used for various purposes.

DESCRIPTION OF REFERENCE NUMERALS 1 wiring circuit board
6 metal supporting layer
7 insulating base layer
9 insulating cover layer
16 wire
20 one-side surface in the thickness direction (wiring body cover portion)
21 the other-side surface in the thickness direction (wiring body cover portion)
23 first resist
24 second resist
25 metal sheet
29 overlapping portion
W1 width (width of the wiring body metal portion)
W2 width (width of the wiring body base portion)
W3 width (width of the wire)
W4 width (width of the wiring body cover portion)

The invention claimed is:

1. A wiring circuit board comprising: a plurality of wiring bodies extending in one direction, the plurality of wiring bodies being separated in a width direction orthogonal to the one direction and a thickness direction; and a connecting body connecting ends in the one direction of the plurality of wiring bodies in the width direction, wherein the wiring circuit board includes: a metal supporting layer; an insulating base layer disposed on a one-side surface in the thickness direction of the metal supporting layer; a conductive layer disposed on a one-side surface in the thickness direction of the insulating base layer; and an insulating cover layer disposed on the one-side surface in the thickness direction of the insulating base layer to cover a part of the conductive layer, wherein the metal supporting layer includes a wiring body metal portion corresponding to a wiring body, and a connecting metal portion corresponding to the connecting body, wherein the insulating base layer includes a wiring body base portion corresponding to the wiring body, and a connecting base portion corresponding to the connecting body, wherein the insulating cover layer includes a wiring body cover portion corresponding to the wiring body, wherein the wiring body cover portion has a width W4 smaller than a width W2 of the wiring body base portion, and wherein the wiring body metal portion has a width W1 smaller than the width W2 of the wiring body base portion.

* * * * *